United States Patent
No (10) Patent No.: US 10,317,744 B2
(45) Date of Patent: Jun. 11, 2019

(54) DISPLAY DEVICE

(71) Applicant: Samsung Display Co., Ltd., Yongin-si, Gyeonggi-Do (KR)

(72) Inventor: Sangyong No, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 311 days.

(21) Appl. No.: 14/924,195

(22) Filed: Oct. 27, 2015

(65) Prior Publication Data

US 2016/0147120 A1    May 26, 2016

(30) Foreign Application Priority Data

Nov. 24, 2014  (KR) .................. 10-2014-0164606

(51) Int. Cl.
| | | |
|---|---|---|
| *H01L 27/12* | (2006.01) | |
| *G02F 1/1335* | (2006.01) | |
| *G02F 1/1343* | (2006.01) | |
| *G02F 1/1362* | (2006.01) | |
| *G02F 1/1368* | (2006.01) | |

(52) U.S. Cl.
CPC ...... *G02F 1/134309* (2013.01); *G02F 1/1368* (2013.01); *G02F 1/133512* (2013.01); *G02F 1/136286* (2013.01); *H01L 27/1218* (2013.01)

(58) Field of Classification Search
CPC ................. G02F 1/134309; G02F 1/133512
See application file for complete search history.

(56) References Cited

U.S. PATENT DOCUMENTS

| | | | |
|---|---|---|---|
| 7,773,167 B2 | 8/2010 | Tsai et al. | |
| 9,118,036 B2 | 8/2015 | Kim | |
| 2009/0161048 A1* | 6/2009 | Satake | G02F 1/133305 349/110 |
| 2013/0266771 A1 | 10/2013 | Kusano et al. | |
| 2015/0234243 A1* | 8/2015 | Oono | G02F 1/133514 349/106 |
| 2015/0301420 A1* | 10/2015 | Yoshida | G02F 1/1345 257/43 |
| 2016/0097950 A1* | 4/2016 | Chang | G02F 1/133512 349/43 |

FOREIGN PATENT DOCUMENTS

| | | | |
|---|---|---|---|
| KR | 20060076845 A | * | 7/2006 |
| KR | 10-2013-0113826 A | | 10/2013 |
| KR | 10-2014-0017161 A | | 2/2014 |
| KR | 10-2014-0055430 A | | 5/2014 |
| KR | 10-2014-0070750 A | | 6/2014 |
| KR | 10-2014-0073271 A | | 6/2014 |

* cited by examiner

*Primary Examiner* — Alexander P Gross
(74) *Attorney, Agent, or Firm* — H.C. Park & Associates, PLC

(57) ABSTRACT

A display device includes a first substrate; a gate line on the first substrate; a data line disposed to intersect the gate line; a thin film transistor (TFT) connected to the gate line and the data line; a pixel electrode connected to the TFT; a second substrate opposed to the first substrate; and a light blocking member on the second substrate, the light blocking member at least partially overlapping the gate line, the data line, and the TFT and defining a pixel region. The pixel electrode may be disposed further away from the center portion of the pixel region, from the center portion of the first substrate toward the left and right sides thereof.

17 Claims, 9 Drawing Sheets

FIG. 8

DISPLAY DEVICE

CLAIM OF PRIORITY

This application claims the priority to and all the benefits accruing under 35 U.S.C. § 119 of Korean Patent Application No. 10-2014-0164606, filed on Nov. 24, 2014, with the Korean Intellectual Property Office (KIPO), the disclosure of which is incorporated herein in its entirety by reference.

BACKGROUND OF THE INVENTION

1. Field of Disclosure

Embodiments of the present invention relate to a curved display device improved in visibility.

2. Description of the Related Art

A liquid crystal display (LCD) device may include two substrates including electrodes formed thereon and a liquid crystal layer interposed therebetween. Upon applying voltage to two electrodes, liquid crystal molecules of the liquid crystal layer are rearranged, such that the amount of transmitted light is adjusted.

In recent years, with customers' needs for a stereoscopic screen that may effectively provide a sense of immersion, researches have been conducted to realize a curved display device having a predetermined radius of curvature.

A radius of curvature refers to a radius of a circular arc which best approximates an outline curve of an object. An object has a flatter figuration as a radius of curvature increases. In contrast, an object has a more round figuration as a radius of curvature decreases.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY OF THE INVENTION

Aspects of embodiments of the present invention are directed to a curved display device improved in visibility.

According to an exemplary embodiment of the present invention, a display device includes: a first substrate; a gate line on the first substrate; a data line disposed to intersect the gate line; a thin film transistor (TFT) connected to the gate line and the data line; a pixel electrode connected to the TFT; a second substrate opposed to the first substrate; and a light blocking member on the second substrate, the light blocking member at least partially overlapping the gate line, the data line, and the TFT and defining a pixel region. The pixel electrode may be disposed further away from the center portion of the pixel region, from the center portion of the first substrate toward the left and right sides thereof.

The pixel electrode may be disposed in the center portion of the pixel region, in the center portion of the first substrate.

The pixel electrode may be disposed further away from the center portion of the pixel region toward the left side thereof, from the center portion of the first substrate toward the right side thereof.

The pixel electrode may be disposed further away from the center portion of the pixel region toward the right side thereof, from the center portion of the first substrate toward the left side thereof.

The first substrate may have a greater radius of curvature than that of the second substrate.

The pixel region may extend longer in a gate line direction than in a data line direction.

A gap between light blocking members may be reduced from the center portion of the second substrate toward the left and right sides thereof.

The display device may further include a compensation electrode extending from an end portion of the pixel electrode and disposed parallel to the data line.

The compensation electrode may include a connector extending from the end portion of the pixel electrode and a compensation unit disposed parallel to the data line.

The connector disposed on the right side with respect to the center portion of the first substrate may extend from a right end portion of the pixel electrode.

The connector may have a longer length from the center portion of the first substrate toward the right side thereof.

The connector disposed on the left side with respect to the center portion of the first substrate may extend from a left end portion of the pixel electrode.

The connector may have a longer length from the center portion of the first substrate toward the left side thereof.

The compensation unit may be provided in a bar shape.

The display device may further include a common electrode on the second substrate; and a liquid crystal layer interposed between the first substrate and the second substrate.

The first substrate has the same radius of curvature as that of the second substrate.

The first substrate has a smaller radius of curvature than that of the second substrate.

The pixel region extends longer in a data line direction than in a gate line direction.

The second substrate is concave-curved toward a user.

The second substrate is convex-curved toward a user.

According to embodiments of the present invention, the disposition of pixel electrodes may differ according to the position of pixel regions in the display device to thereby have improved visibility.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 1:
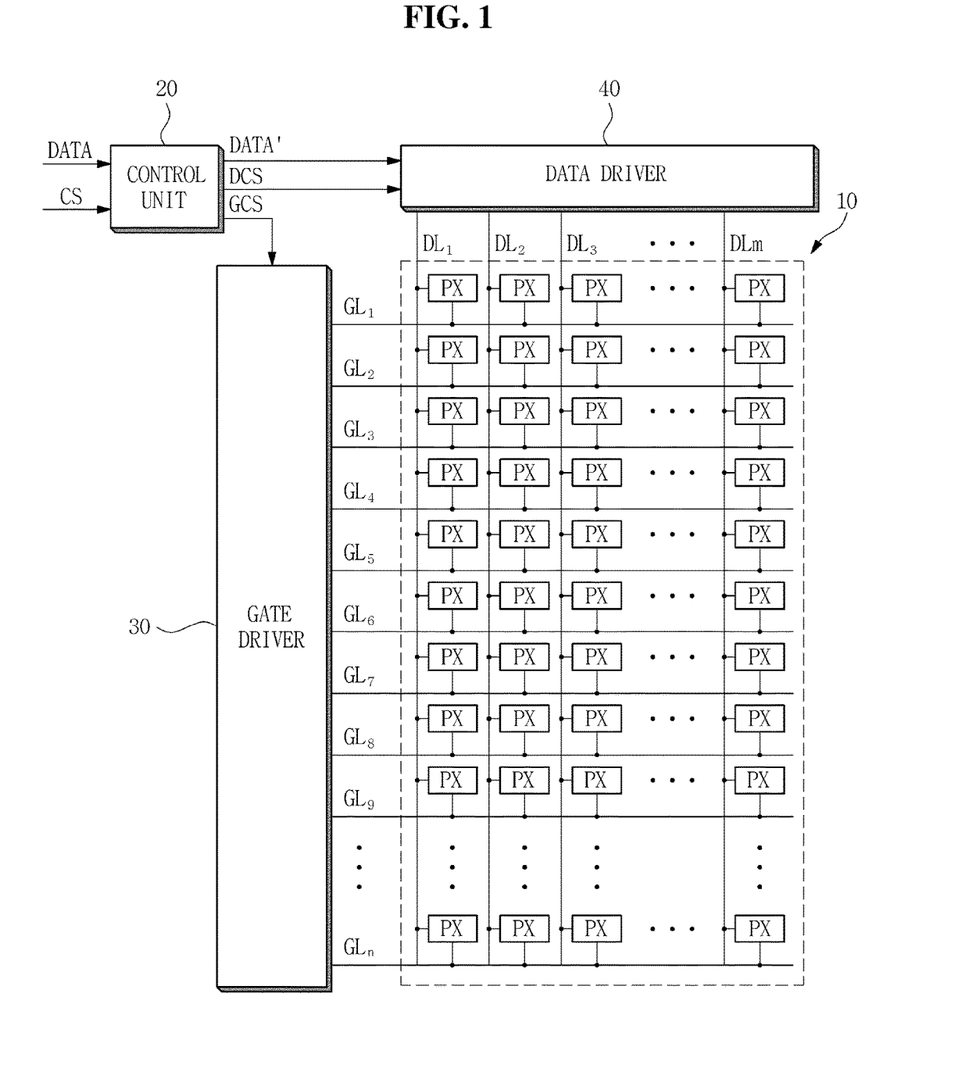
FIG. 1 is a block diagram illustrating a display device according to an exemplary embodiment.
Figure 2A:
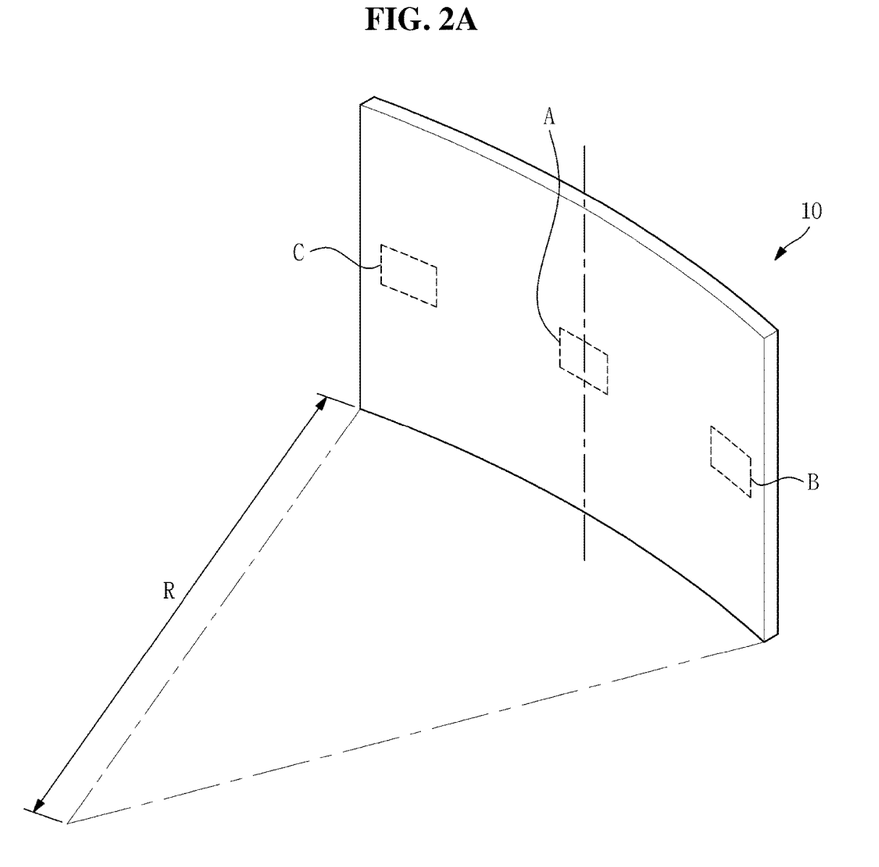
FIG. 2A is a schematic perspective view illustrating a display panel of FIG. 1.
Figure 2B:
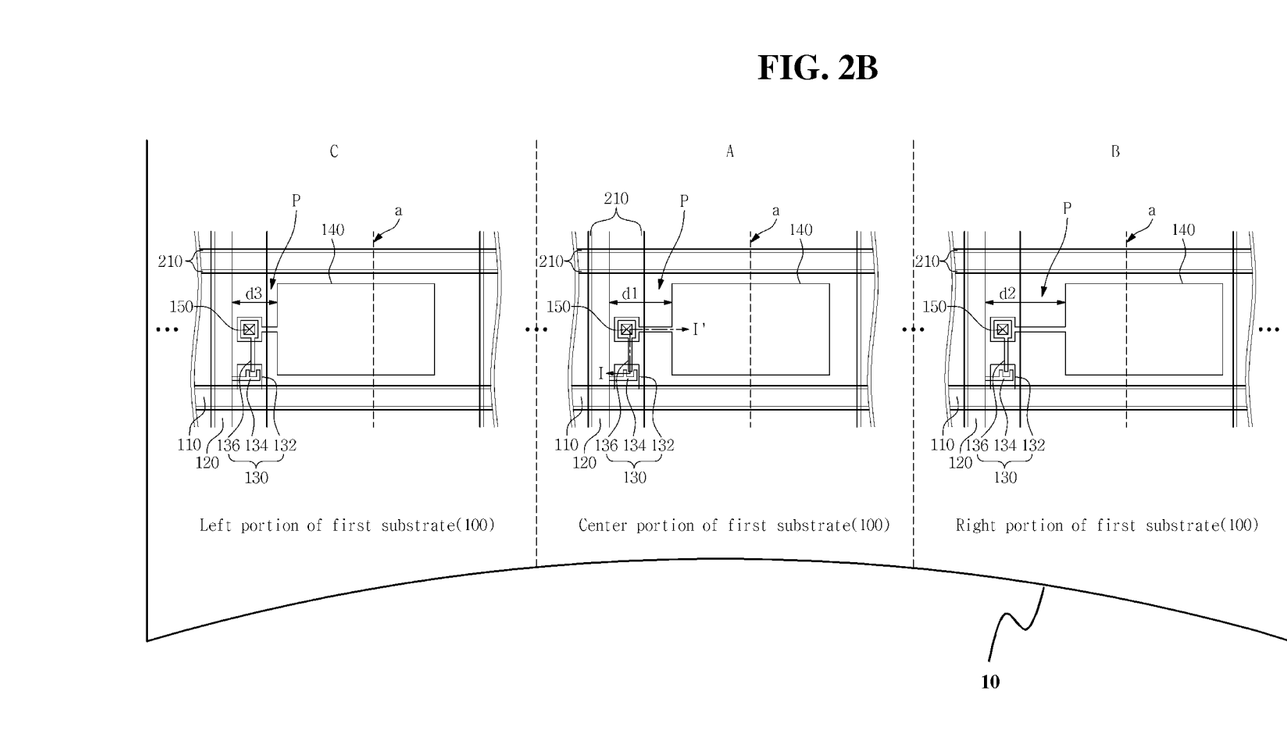
FIG. 2B is a front view illustrating the display panel of FIG. 2A.

FIG. 1 is a block diagram illustrating a display device according to an exemplary embodiment. FIG. 2A is a schematic perspective view illustrating a display panel of FIG. 1, and FIG. 2B is a front view of the display panel in FIG. 2A.

The display device according to an exemplary embodiment may include a display panel 10 including a plurality of pixels PXs, a control unit 20 configured to process an image signal DATA and a control signal CS, which are externally received, to thereby output various signals, a gate driver 30 configured to supply a gate signal to gate lines GL1~GLn, and a data driver 40 configured to supply a data voltage to data lines DL1~DLm.

The display panel 10 may be a curved-type display panel having a predetermined radius of curvature R, for example, an LCD panel. The display panel 10 may include the plurality of gate lines GL1~GLn for transmitting the gate signal in a row direction, the plurality of data lines DL1~DLm for transmitting the data voltage in a column direction, and the plurality of pixels PXs arranged in a matrix form connected to the gate and data lines.

The control unit 20 is configured to output a corrected image signal DATA' to the data driver 40 based on the externally supplied image signal DATA. Further, the control unit 20, based on the externally received control signal CS, may supply a gate control signal GCS to the gate driver 30 and a data control signal DCS to the data driver 40. For example, the control signal CS may be a timing signal such as a vertical synchronization signal Vsync, a horizontal synchronization signal Hsync, a clock signal CLK, and a data enable signal DE. Further, the image signal DATA may be a digital signal representing a gray level of light emitted from the pixel PX.

The gate driver 30 is configured to receive the gate control signal GCS from the control unit 20 to thereby generate a gate signal and to supply the gate signal to the pixels PXs respectively connected to the plurality of gate lines GL1~GLn. As the gate signals are sequentially supplied to the pixels PXs, the data voltages may be sequentially applied to the pixels PXs.

The data driver 40 is configured to receive the data control signal DCS and the corrected image signal DATA' from the control unit 20, and to apply a data voltage corresponding to the corrected image signal DATA' to the pixels PXs respectively connected to the plurality of data lines DL1~DLm in response to the data control signal DCS.

Figure 3:
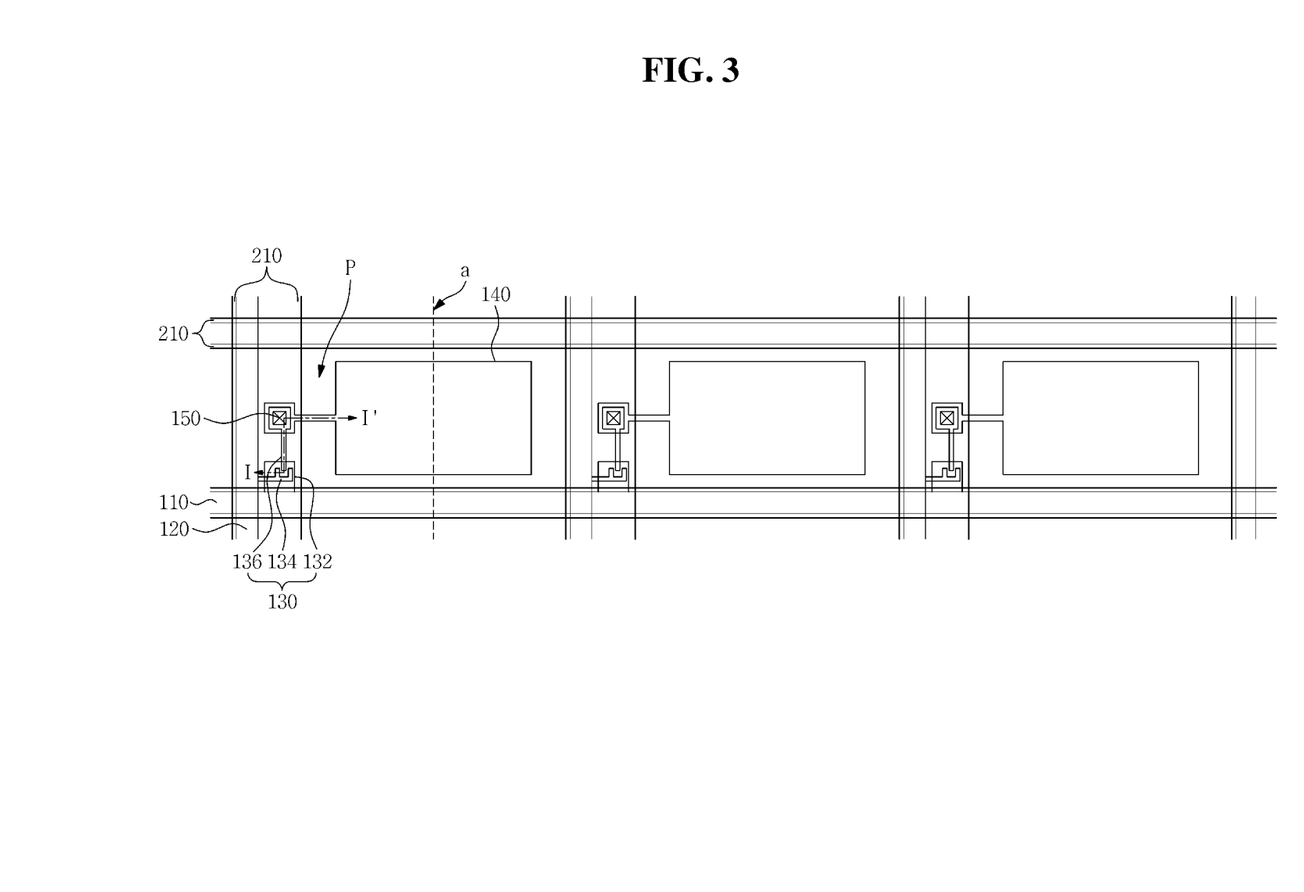
FIG. 3 is a plan view illustrating a pixel on portion A of FIG. 2A according to an exemplary embodiment.
Figure 4:
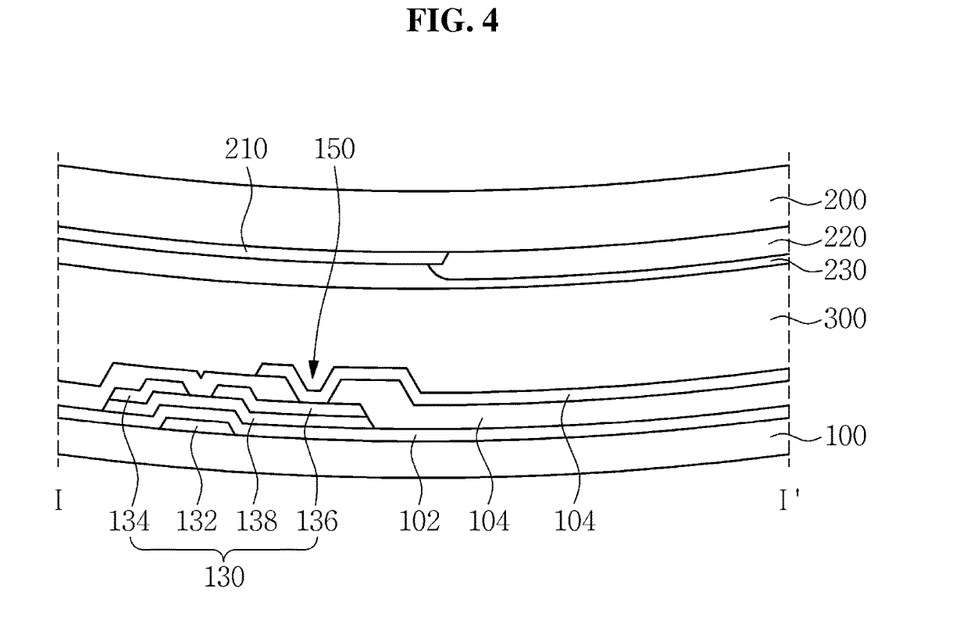
FIG. 4 is a cross-sectional view taken along line I-I' of FIG. 3.
Figure 5:
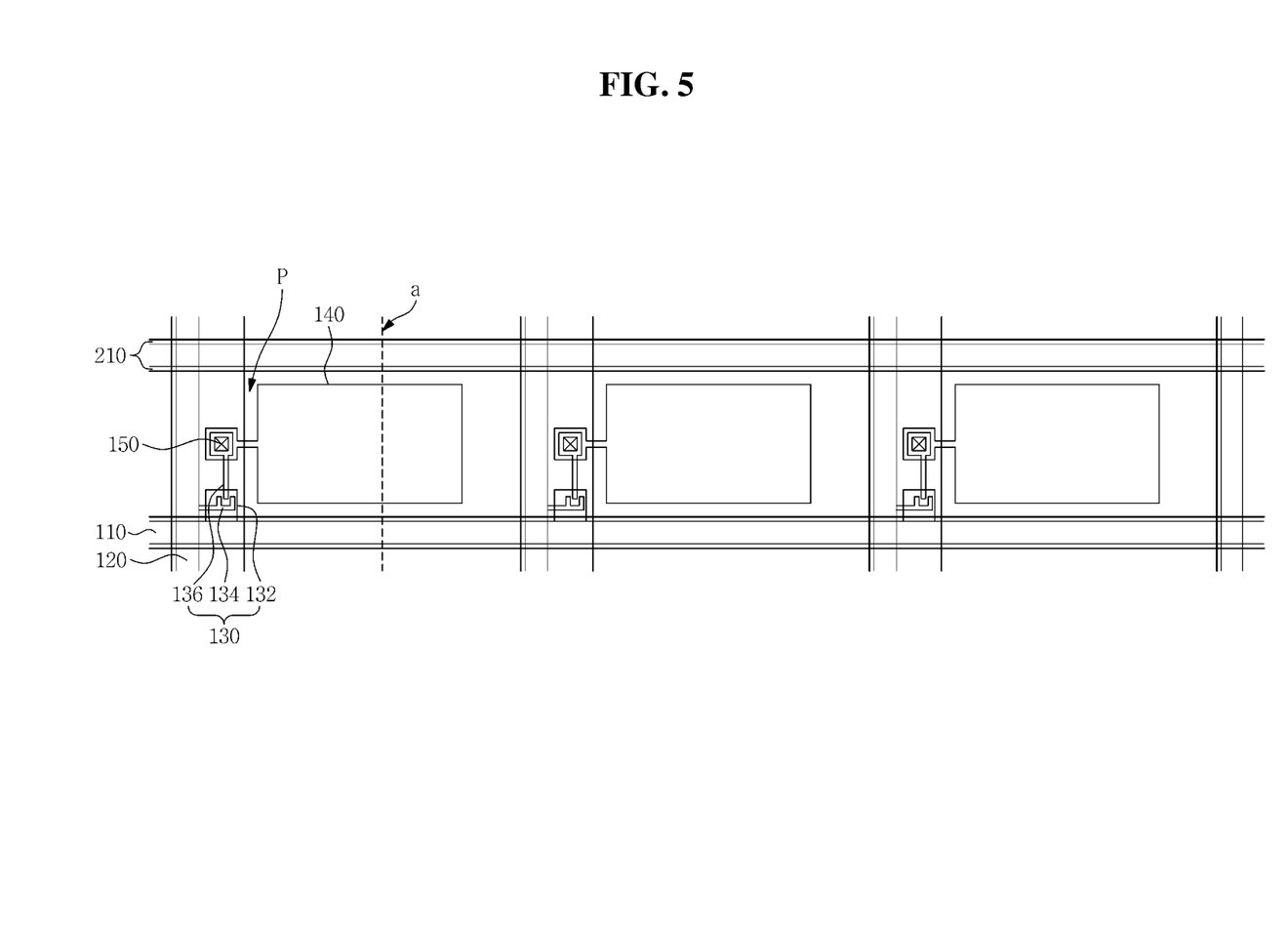
FIG. 5 is a plan view illustrating a pixel on portion B of FIG. 2A according to an exemplary embodiment.
Figure 6:
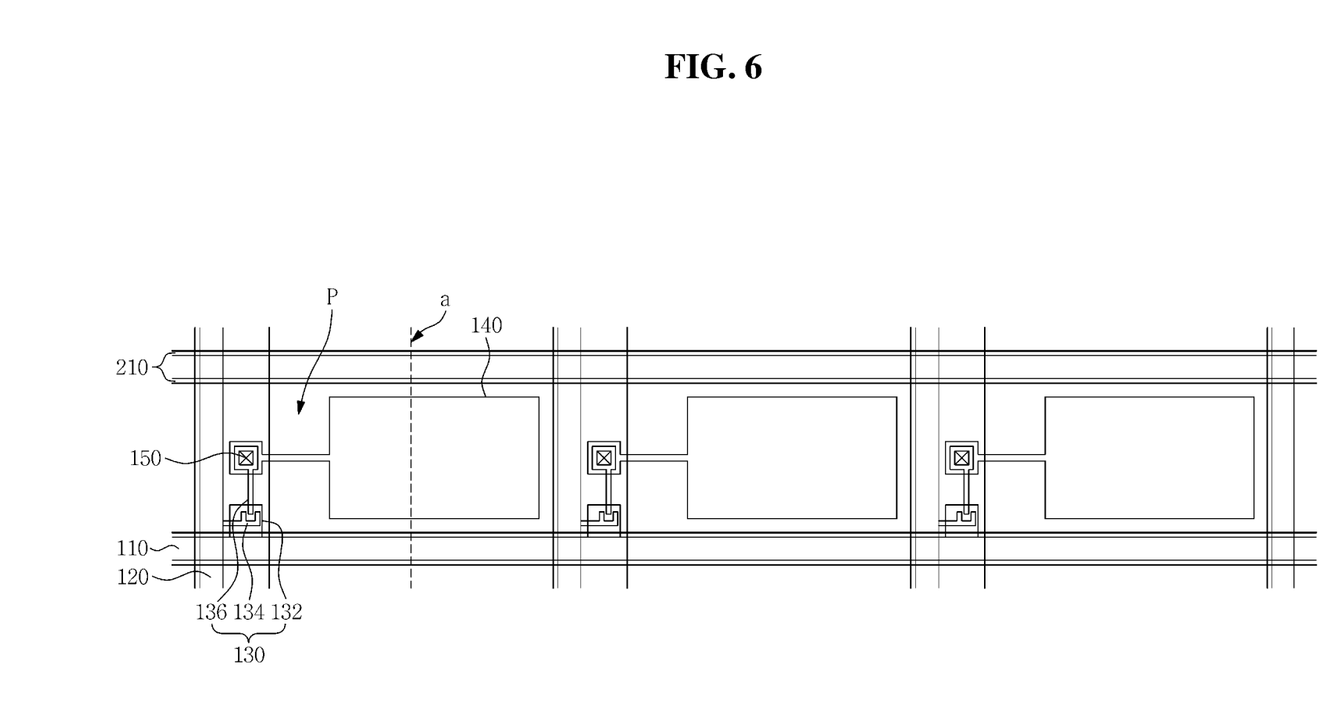
FIG. 6 is a plan view illustrating a pixel on portion C of FIG. 2A according to an exemplary embodiment.

FIG. 3 is a plan view illustrating a pixel on portion A of FIG. 2A according to an exemplary embodiment. FIG. 4 is a cross-sectional view taken along line I-I' of FIG. 3. FIG. 5 is a plan view illustrating a pixel on portion B of FIG. 2A according to an exemplary embodiment. FIG. 6 is a plan view illustrating a pixel on portion C of FIG. 2A according to an exemplary embodiment.

A first substrate 100 may include transparent glass, plastic, or the like, and may be provided in a curved type having a predetermined radius of curvature.

The gate line 110 may be disposed on the first substrate 100 in a horizontal direction. The gate line 110 may include, for example, an aluminum (Al) based metal such as Al or an Al alloy, a silver (Ag) based metal such as Ag or an Ag alloy, a copper (Cu) based metal such as Cu or a Cu alloy, a molybdenum (Mo) based metal such as Mo or a Mo alloy, chromium (Cr), tantalum (Ta), and titanium (Ti), but is not limited thereto. In some embodiments, the gate line 110 may have a multi-layer structure including at least two conductive layers that have different physical properties.

The data line 120 may be disposed in a longitudinal direction to intersect the gate line 110, and may be insulated from the gate line 110 by a gate insulating layer 102. The data line 120 may include refractory metal, such as molybdenum, chromium, tantalum and titanium or metal alloys thereof, but is not limited thereto. In some embodiments, the data line 120 may have a multi-layer structure including a refractory metal layer and a low-resistance conductive layer.

A thin film transistor (TFT) 130 may include a gate electrode 132 connected to the gate line 110, a source electrode 134 connected to the data line 120, and a drain electrode 136 connected to the pixel electrode 140 through a contact hole 150.

The gate electrode 132 may be insulated from the source electrode 134 and the drain electrode 136 by a gate insulating layer 102. A semiconductor layer 138 may be disposed between the gate insulating layer 102 and the source electrode 134 and between the gate insulating layer 102 and the drain electrode 136. In addition, a protection layer 104 including organic insulating materials or inorganic insulating materials may be disposed on the source electrode 134 and the drain electrode 136.

The pixel electrode 140 may be disposed on the protection layer 104 and may be connected to the drain electrode 136 through the contact hole 150.

The pixel electrode 140 may include optically transparent and electrically conductive materials. The pixel electrode 140 may have a structure where a cross-shaped stem electrode including a transverse stem electrode and a longitudinal stem electrode includes branch electrodes extending toward four different directions therefrom. However, the shape of the pixel electrode 140 may vary, and the scope of the present invention is not limited to the shape thereof.

Although not illustrated, an alignment layer may be further disposed on the pixel electrode 140. The alignment layer may be a homeotropic alignment layer or a photo-alignment layer including photopolymer materials. The photopolymer material may be a reactive monomer or a reactive mesogen.

The arrangement of the pixel electrode 140 will be described below in the description pertaining to the pixel region P.

The second substrate 200 may be opposed to the first substrate 100 and may include transparent glass, plastics, or the like.

The second substrate 200 may have a predetermined radius of curvature, and the first substrate 100 may desirably have a greater radius of curvature than that of the second substrate 200.

The light blocking member 210 may be disposed on the second substrate 200 and more particularly, a gap between the light blocking members 210 may be further reduced from the center portion of the second substrate 200 toward left and right side portions thereof.

The light blocking member 210 may at least partially overlap the gate line 110, the data line 120, and the TFT 130 to define a pixel region P, and may prevent light leakage by blocking the gate line 110, the data line 120, and the TFT 130.

The pixel region P, when viewed along the plane, may be quadrangular in shape. The pixel region P may desirably extend longer in a gate line 110 direction than in a data line 120 direction. However, the present invention is not limited thereto, and pixel region P may extend longer in the data line 120 direction than in the gate line 110 direction.

The pixel electrode 140 may be disposed further away from the center portion of the pixel region P, from the center portion A of the first substrate 100 toward the right side B and the left side C thereof.

In more detail, the pixel electrode 140 may be disposed in the center portion of the pixel region P, in the center portion A of the first substrate 100. In other words, the pixel electrode 140 may be disposed symmetrically with respect to a longitudinal center line a of the pixel region P.

The pixel electrode 140 may be disposed further away from the center portion of the pixel region P toward the left side thereof, from the center portion A of the first substrate 100 toward the right side B thereof. In other words, the pixel electrode 140 may deviate toward the left side with respect to the longitudinal center line a of the pixel region P. In this case, from the center portion A of the first substrate 100 toward the right side B thereof, degree of deviation toward the left side, with respect to the longitudinal center line a of the pixel region P, may gradually increase. The more the pixel electrode 140 is positioned adjacent the right side of the first substrate 100, the longer the distance between the pixel electrode 140 and the data line 120 is. The pixel electrode 140 is connected with the data line 120 by the TFT 130. For example, as shown in FIG. 2B, a distance d2 is longer than a distance d1.

The pixel electrode 140 may be disposed further away from the center portion of the pixel region P toward the right side thereof, from the center portion A of the first substrate 100 toward the left side C thereof. In other words, the pixel electrode 140 may deviate toward the right side with respect to the longitudinal center line a of the pixel region P defined by the light blocking members 210. In this case, from the center portion A of the first substrate 100 toward the left side C thereof, degree of deviation toward the right side, with respect to the longitudinal center line a of the pixel region P, may gradually increase. The more the pixel electrode 140 is positioned adjacent the left side of the first substrate 100, the shorter the distance between the pixel electrode 140 and the data line 120 is. The pixel electrode 140 is connected with the data line 120 by the TFT 130. For example, as shown in FIG. 2B, a distance d3 is shorter than a distance d1.

In order to manufacture conventional curved-type display devices, a light blocking member disposed in a longitudinal direction may be aligned with a data line and a TFT on a flat panel, and then may be bent to have a predetermined radius of curvature. Such conventional curved display devices may be disadvantageous in that from the center portion of a first substrate to the left and right sides thereof, due to a difference between radius of curvatures of the first and second substrates, the light blocking member may not entirely cover the data line and the TFT to partially expose them or may partially cover the pixel electrode.

In the display device according to an exemplary embodiment of the present invention, on a flat panel, the light blocking member 210 disposed in the center portion of the second substrate 200 may be aligned with the data line 120 and the TFT 130, while the light blocking member 210 disposed on the right side or on the left side of the second substrate 200 may be shifted toward the left side or toward the right side to partially expose the data line 120 and the TFT 130.

The extent of shift of the light blocking member 210 may be suitably adjusted in accordance with changes in the radius of curvature of the first substrate 100 or the second substrate 200 and may gradually increase from the center portion of the second substrate 200 toward the right side or the left side thereof.

Further, in the display device according to an exemplary embodiment provided in a flat panel form, the pixel electrode 140 may be shifted in a direction the same as the shifting direction of the light blocking member 210, such that the pixel electrode 140 may not overlap the light blocking member 210. In this case, the extent of shift of the pixel electrode 140 may be equivalent to that of the light blocking member 210.

Accordingly, when the display device according to an exemplary embodiment has a curved panel form, the light blocking member 210 may entirely cover the data line 120 and the TFT 130 and may not simultaneously cover the pixel electrode 140, such that light transmittance and visibility may be improved.

The color filter 220 may be disposed on the pixel region P of the second substrate 200. However, the present invention is not limited thereto, and the color filter 220 may be disposed on the pixel region P of the first substrate 100.

The color filter 220 may display one of the primary colors, such as the three primary colors of red, green, and blue, but is not limited thereto. The color filter 220 may display one of cyan, magenta, yellow, and white.

The color filters 220 in adjacent pixel regions P may be disposed to have different colors. For example, the color filters 220 may be arranged in the order of red, green and blue or may be arranged in the order of red, green, blue, and white. However, the arrangement of the color filters 220 may be modified into different orders, and the scope of the present invention is not limited to the arrangement of the color filters 220.

The common electrode 230 may include optically transparent and electrically conductive materials. The common electrode 230 may be provided as a single panel on an entire surface of the second substrate 200 to thereby cover the light blocking member 210 and the color filter 220. However, the present invention is not limited thereto and the common electrode 230 may have a predetermined pattern.

Although not illustrated, an alignment layer may be further disposed on the common electrode 230. The alignment layer may be a homeotropic alignment layer or a photo-alignment layer including photopolymer materials. The photopolymer material may be a reactive monomer or a reactive mesogen.

The liquid crystal layer 300 may be interposed between the first and second substrates 100 and 200. The liquid crystal layer 300 may include photopolymer materials. The photopolymer material may include a reactive monomer or a reactive mesogen.

Figure 7:
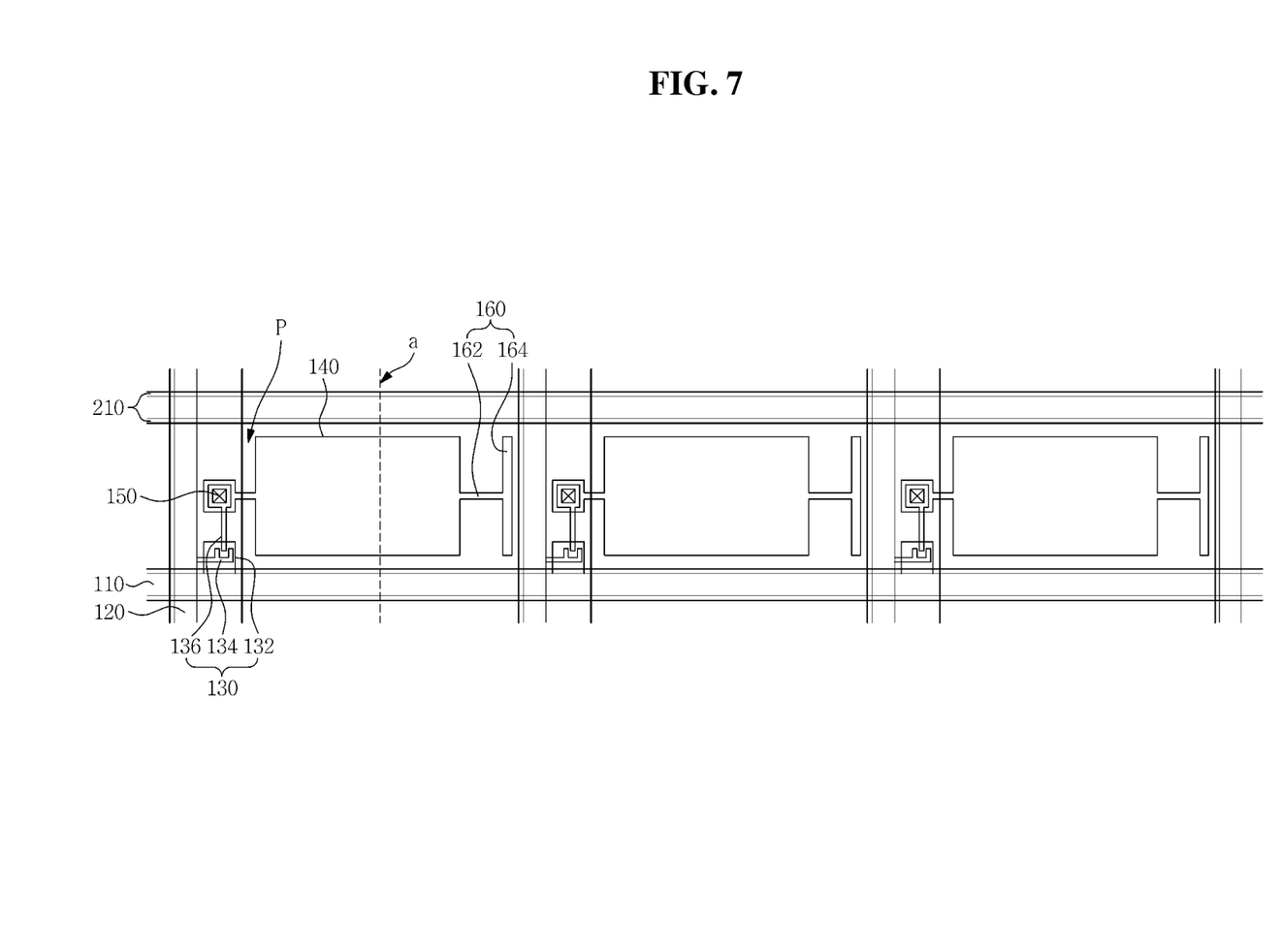
FIG. 7 is a plan view illustrating a pixel on portion B of FIG. 2A according to another exemplary embodiment.
Figure 8:
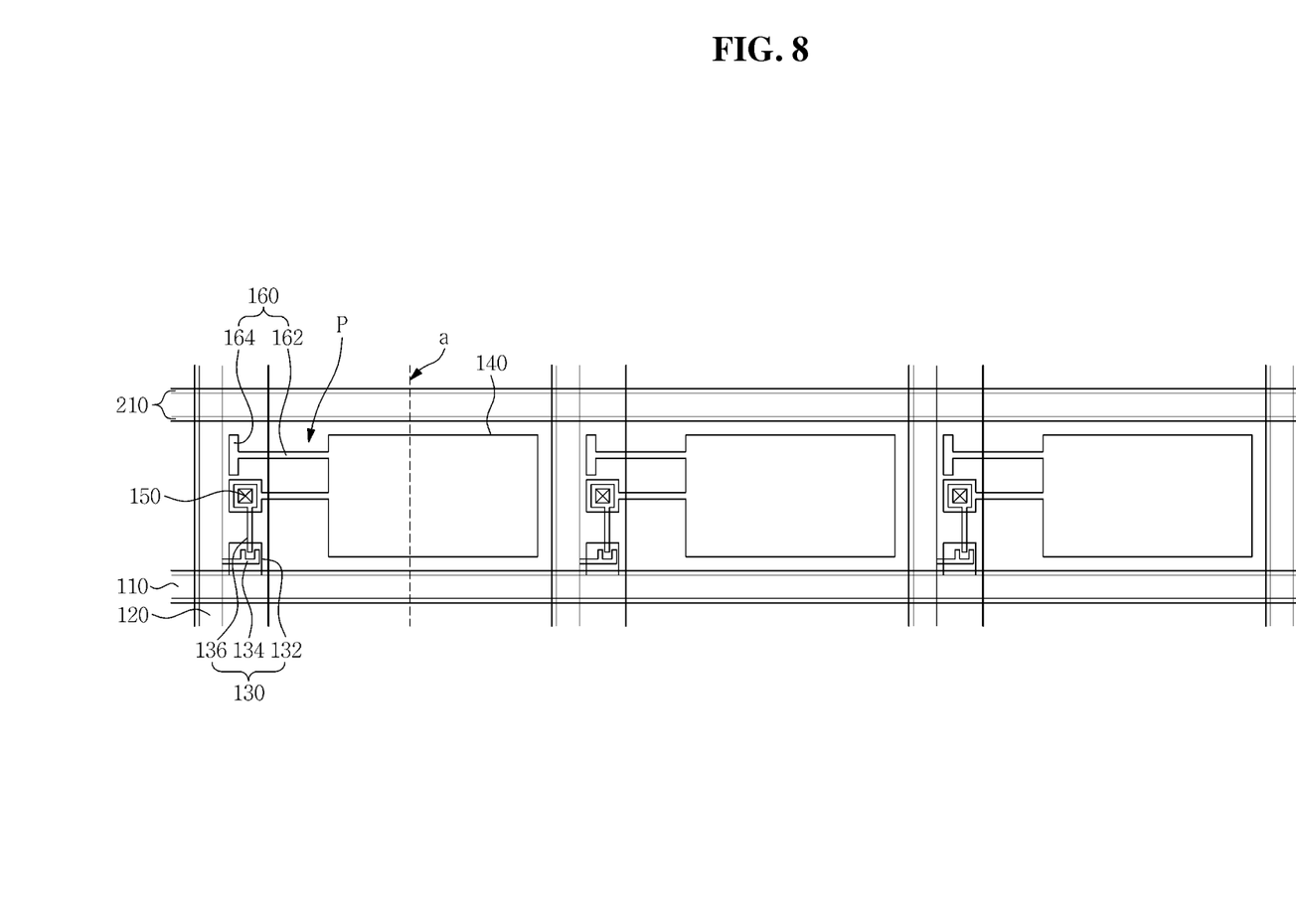
FIG. 8 is a plan view illustrating a pixel on portion C of FIG. 2A according to another exemplary embodiment.

FIG. 7 is a plan view illustrating a pixel on portion B of FIG. 2A according to another exemplary embodiment. FIG. 8 is a plan view illustrating a pixel on portion C of FIG. 2A according to another exemplary embodiment.

Referring to FIGS. 2B, 7, and 8, a display device according to another exemplary embodiment has configurations identical to those of the display device illustrated in FIGS. 5 and 6, apart from further including a compensation electrode 160 extending from an end portion of a pixel electrode 140 in parallel with a data line 120, and thus, the repeated description will be omitted for conciseness.

The compensation electrode 160 may include a connector 162 extending from an end portion of the pixel electrode 140 and a compensation unit 164 disposed parallel to the data line 120.

The compensation electrode 160 may include materials the same as those of the pixel electrode 140 and may include optically transparent and electrically conductive materials.

The connectors 162 that are disposed on the right side with respect to the center portion A of the first substrate 100 may extend from a right end portion of the pixel electrode 140. In this case, the length of the connector 162 may gradually increase from the center portion A of the first substrate 100 toward the right side B thereof.

The connectors 162 that are disposed on the left side with respect to the center portion A of the first substrate 100 may extend from a left end portion of the pixel electrode 140. In this case, the length of the connector 162 may gradually increase from the center portion A of the first substrate 100 toward the left side C thereof.

The compensation unit 164 may be provided in a bar shape and the width of the compensation unit 162 may vary according to the position of the pixel electrode 140.

The compensation electrode 160 may be disposed between the pixel electrode 140 and the data line 120, thereby achieving capacitance balance between the pixel electrode 140 and the data lines 120 provided on both sides of the pixel electrode 140.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A curved display device comprises
a first substrate;
a gate line on the first substrate;
a data line disposed on the first substrate to intersect the gate line;
a thin film transistor (TFT) connected to the gate line and the data line;
a pixel electrode connected to the TFT, the pixel electrode being disposed in a pixel region; and
a second substrate opposed to the first substrate,
wherein:
a first TFT is connected to the gate line, a first data line, and a first pixel electrode disposed in a center portion of the first substrate;
a second TFT is connected to the gate line, a second data line, and a second pixel electrode disposed in a left side portion of the first substrate; and
a first distance between the first data line and the first pixel electrode is greater than a second distance between the second data line and the second pixel electrode,
wherein the pixel electrode and the pixel region exist in plurality such that the pixel electrodes are disposed away from the center portion of the pixel region toward a left side of the pixel region, from the center portion of the first substrate toward the left side of the first substrate.

2. The display device of claim 1, the pixel electrode is disposed in the center portion of the pixel region, in the center portion of the first substrate.

3. The display device of claim 1, wherein the pixel electrode and the pixel region exist in plurality such that the pixel electrodes are disposed further away from the center portion of the pixel region toward a right side of the pixel region, from the center portion of the first substrate toward the right side.

4. The display device of claim 1, the first substrate has a greater radius of curvature than that of the second substrate.

5. The display device of claim 1, the pixel region extends longer in a gate line direction than in a data line direction.

6. The display device of claim 1, a gap between light blocking members is reduced from the center portion of the first substrate toward the left and right sides of the first substrate.

7. The display device of claim 1, further comprises a common electrode on the second substrate; and
a liquid crystal layer interposed between the first substrate and the second substrate.

8. The display device of claim 1, the first substrate has the same radius of curvature as that of the second substrate.

9. The display device of claim 1, the first substrate has a smaller radius of curvature than that of the second substrate.

10. The display device of claim 1, the pixel region extends longer in a data line direction than in a gate line direction.

11. The display device of claim 1, the second substrate is concave-curved toward a user.

12. The display device of claim 1, the second substrate is convex-curved toward a user.

13. The display device of claim 1, further comprising a light blocking member disposed on the second substrate, the light blocking member at least partially overlapping the gate line, the data line, and the TFT, and defining the pixel region.

14. The display device of claim 1, wherein a third TFT is connected to the gate line, a third data line, and a third pixel electrode disposed in a right side portion of the first substrate; and
the first distance is less than a third distance between the third data line and the third pixel electrode.

15. A curved display device comprises
a first substrate;
a gate line on the first substrate;
a data line disposed on the first substrate to intersect the gate line;
a thin film transistor (TFT) connected to the gate line and the data line;
a pixel electrode connected to the TFT;
a second substrate opposed to the first substrate;
a light blocking member disposed on the second substrate, the light blocking member at least partially overlapping the gate line, the data line, and the TFT and defining a pixel region; and
a compensation electrode extending from an end portion of the pixel electrode and disposed parallel to the data line,
wherein:
the pixel electrode and the pixel region exist in plurality such that the pixel electrodes are disposed further away from the center portion of the pixel region, from the center portion of the first substrate toward the left and right sides of the first substrate;
the compensation electrode comprises a connector extending from the end portion of the pixel electrode and connecting a compensation unit disposed parallel to the data line;
the connector disposed on the right side with respect to the center portion of the first substrate extends from a right end portion of the pixel electrode; and
the connector has a longer length from the center portion of the first substrate toward the right side of the first substrate.

16. A curved display device comprises
a first substrate;
a gate line on the first substrate;
a data line disposed on the first substrate to intersect the gate line;
a thin film transistor (TFT) connected to the gate line and the data line;
a pixel electrode connected to the TFT;
a second substrate opposed to the first substrate;
a light blocking member disposed on the second substrate, the light blocking member at least partially overlapping the gate line, the data line, and the TFT and defining a pixel region; and
a compensation electrode extending from an end portion of the pixel electrode and disposed parallel to the data line,
wherein:
the pixel electrode and the pixel region exist in plurality such that the pixel electrodes are disposed further away from the center portion of the pixel region from the center portion of the first substrate toward the left and right sides of the first substrate;
the compensation electrode comprises a connector extending from the end portion of the pixel electrode and connecting a compensation unit disposed parallel to the data line;
the connector disposed on the left side with respect to the center portion of the first substrate extends from a left end portion of the pixel electrode; and
the connector has a longer length from the center portion of the first substrate toward the left side of the first substrate.

17. The display device of claim 16, wherein the compensation unit has a bar shape.

* * * * *